(12) United States Patent
Kamano (10) Patent No.: US 9,865,312 B2
(45) Date of Patent: Jan. 9, 2018

(54) SEMICONDUCTOR DEVICE AND SEMICONDUCTOR MEMORY DEVICE

(71) Applicant: LAPIS Semiconductor Co., Ltd., Yokohama (JP)

(72) Inventor: Shuhei Kamano, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/417,386

(22) Filed: Jan. 27, 2017

(65) Prior Publication Data

US 2017/0213582 A1 Jul. 27, 2017

(30) Foreign Application Priority Data

Jan. 27, 2016 (JP) ................... 2016-013631

(51) Int. Cl.
| | |
|---|---|
| G11C 7/10 | (2006.01) |
| G11C 5/14 | (2006.01) |
| G11C 7/12 | (2006.01) |
| G11C 16/20 | (2006.01) |
| G11C 16/26 | (2006.01) |
| G11C 5/06 | (2006.01) |

(52) U.S. Cl.
CPC ............ *G11C 7/1069* (2013.01); *G11C 5/148* (2013.01); *G11C 7/12* (2013.01); *G11C 16/20* (2013.01); *G11C 16/26* (2013.01); *G11C 5/066* (2013.01); *G11C 7/1006* (2013.01); *G11C 7/1051* (2013.01)

(58) Field of Classification Search
CPC ...... G11C 7/1006; G11C 5/066; G11C 7/1051
USPC ...................................... 365/189.03
See application file for complete search history.

(56) References Cited

U.S. PATENT DOCUMENTS

2011/0317495 A1* 12/2011 Ishikawa .............. G11C 7/1066
365/189.03

FOREIGN PATENT DOCUMENTS

JP    2009-225421 A    10/2009

* cited by examiner

*Primary Examiner* — Jason Lappas
(74) *Attorney, Agent, or Firm* — Rabin & Berdo, P.C.

(57) ABSTRACT

A semiconductor device includes an output driver having a variable current driving ability, for outputting an amplified data signal to the outside through a transmission line; a nonvolatile memory having a specific area for storing output adjustment data to adjust the current driving ability of the output driver; an output adjustment data readout unit for reading out the output adjustment data from the specific area of the memory in response to powering on; and a current driving ability adjustment unit for adjusting the current driving ability of the output driver on the basis of the output adjustment data read out from the memory.

7 Claims, 11 Drawing Sheets

| | AJ0 (DT0) | PDS | NDS | FIRST PP AMPLIFIER (Q1,Q3) | SECOND PP AMPLIFIER (Q2,Q4) | CURRENT DRIVING ABILITY |
|---|---|---|---|---|---|---|
| LOW OUTPUT CURRENT MODE | 0 | 0 | 1 | ACTIVE | INACTIVE | LOW |
| HIGH OUTPUT CURRENT MODE | 1 | 1 | 0 | ACTIVE | ACTIVE | HIGH |

| OUTPUT ADJUSTMENT DATA 0 1 2 3 | PDS 0 1 | NDS 0 1 | P CHANNEL Q1 | P CHANNEL Q2 | P CHANNEL Q5 | N CHANNEL Q3 | N CHANNEL Q4 | N CHANNEL Q6 | P-CHANNEL OUTPUT CURRENT | N-CHANNEL OUTPUT CURRENT |
|---|---|---|---|---|---|---|---|---|---|---|
| 0 0 0 0 | 1 1 | 0 0 | ACT | ACT | ACT | ACT | ACT | ACT | 4·IP | 4·IN |
| 1 0 0 0 | 0 1 | 0 0 | ACT | INACT | ACT | ACT | ACT | ACT | 3·IP | 4·IN |
| 0 1 0 0 | 1 0 | 0 0 | ACT | ACT | INACT | ACT | ACT | ACT | 2·IP | 4·IN |
| 1 1 0 0 | 0 0 | 0 0 | ACT | INACT | INACT | ACT | ACT | ACT | IP | 4·IN |
| 0 0 1 0 | 1 1 | 1 0 | ACT | ACT | ACT | ACT | INACT | ACT | 4·IP | 3·IN |
| 1 0 1 0 | 0 1 | 1 0 | ACT | INACT | ACT | ACT | INACT | ACT | 3·IP | 3·IN |
| 0 1 1 0 | 1 0 | 1 0 | ACT | ACT | INACT | ACT | INACT | ACT | 2·IP | 3·IN |
| 1 1 1 0 | 0 0 | 1 0 | ACT | INACT | INACT | ACT | INACT | ACT | IP | 3·IN |
| 0 0 0 1 | 1 1 | 0 1 | ACT | ACT | ACT | ACT | ACT | INACT | 4·IP | 2·IN |
| 1 0 0 1 | 0 1 | 0 1 | ACT | INACT | ACT | ACT | ACT | INACT | 3·IP | 2·IN |
| 0 1 0 1 | 1 0 | 0 1 | ACT | ACT | INACT | ACT | ACT | INACT | 2·IP | 2·IN |
| 1 1 0 1 | 0 0 | 0 1 | ACT | INACT | INACT | ACT | ACT | INACT | IP | 2·IN |
| 0 0 1 1 | 1 1 | 1 1 | ACT | ACT | ACT | ACT | INACT | INACT | 4·IP | IN |
| 1 0 1 1 | 0 1 | 1 1 | ACT | INACT | ACT | ACT | INACT | INACT | 3·IP | IN |
| 0 1 1 1 | 1 0 | 1 1 | ACT | ACT | INACT | ACT | INACT | INACT | 2·IP | IN |
| 1 1 1 1 | 0 0 | 1 1 | ACT | INACT | INACT | ACT | INACT | INACT | IP | IN |

ACT : ACTIVE
INACT : INACTIVE

SEMICONDUCTOR DEVICE AND SEMICONDUCTOR MEMORY DEVICE

BACKGROUND OF THE INVENTION

1. Field of the Invention

The present invention relates to a semiconductor device, more particularly to a semiconductor device including an output driver for outputting an internally generated data signal to the outside, and a semiconductor memory device.

2. Description of the Related Art

In semiconductor devices, for example, semiconductor IC chips, some of various types of internally generated signals are output to the outside through a dedicated output driver.

As such an output driver, a data output circuit that can adjust its own driving force, that is, current driving ability is proposed (for example, Japanese Patent Application Laid-Open No. 2009-225421).

The data output circuit is provided with a fuse element, which indicates information to specify a driving force required by a user by a connected or disconnected state. The driving force of the data driver is adjusted on the basis of a binary setting signal that corresponds to the connected or disconnected state of the fuse element.

However, the data output circuit described above is required to have the fuse element that occupies a relatively large area in the chip for the purpose of setting an adjustment value to adjust the driving force of the data driver, thus causing an increase in the size of the device. In addition, a unit specific to a disconnection process of the fuse element is required to be provided, thus causing an increase in manufacturing cost.

SUMMARY OF THE INVENTION

The present invention aims at providing a semiconductor device and a semiconductor memory device that can adjust the current driving ability of an output driver without increases in manufacturing cost and the size of the devices.

A semiconductor device according to one aspect of the present invention includes an output driver having a variable current driving ability, for outputting an amplified data signal to the outside through a transmission line; a nonvolatile memory having a specific area for storing output adjustment data to adjust the current driving ability of the output driver; an output adjustment data readout unit for reading out the output adjustment data from the specific area of the memory in response to powering on; and a current driving ability adjustment unit for adjusting the current driving ability of the output driver on the basis of the output adjustment data read out from the memory.

A semiconductor memory device according to one aspect of the present invention includes a nonvolatile memory unit having a data area in which a data storage address is specified by a data address and a specific area for storing output adjustment data to adjust a current driving ability; an output driver having a variable current driving ability, for outputting data read out from the memory unit to the outside; an output adjustment data readout unit for reading out the output adjustment data from the specific area of the memory unit in response to powering on; and a current driving ability adjustment unit for adjusting the current driving ability of the output driver on the basis of the output adjustment data read out from the memory unit.

According to the present invention, the output adjustment data to adjust the current driving ability (or output current supply ability) of the output driver is stored in the nonvolatile memory. The output adjustment data is automatically read out from the memory in response to powering on, and the current driving ability of the output driver is adjusted on the basis of the output adjustment data.

Therefore, the present invention allows reducing the size of the device, as compared with a device in which an adjustment value to adjust the current driving ability of an output driver is set using a fuse element that occupies a relatively large area in a semiconductor chip. Furthermore, the present invention eliminates the need for providing a unit specific to a disconnection process of the fuse element, thus allowing a reduction in manufacturing cost.

BRIEF DESCRIPTION OF THE DRAWINGS

FIG. 2 is a timing chart of a readout operation of output adjustment data at the time of powering on;

DETAILED DESCRIPTION OF THE INVENTION

Embodiments of the present invention will be described below in detail with reference to the drawings.

Figure 1:
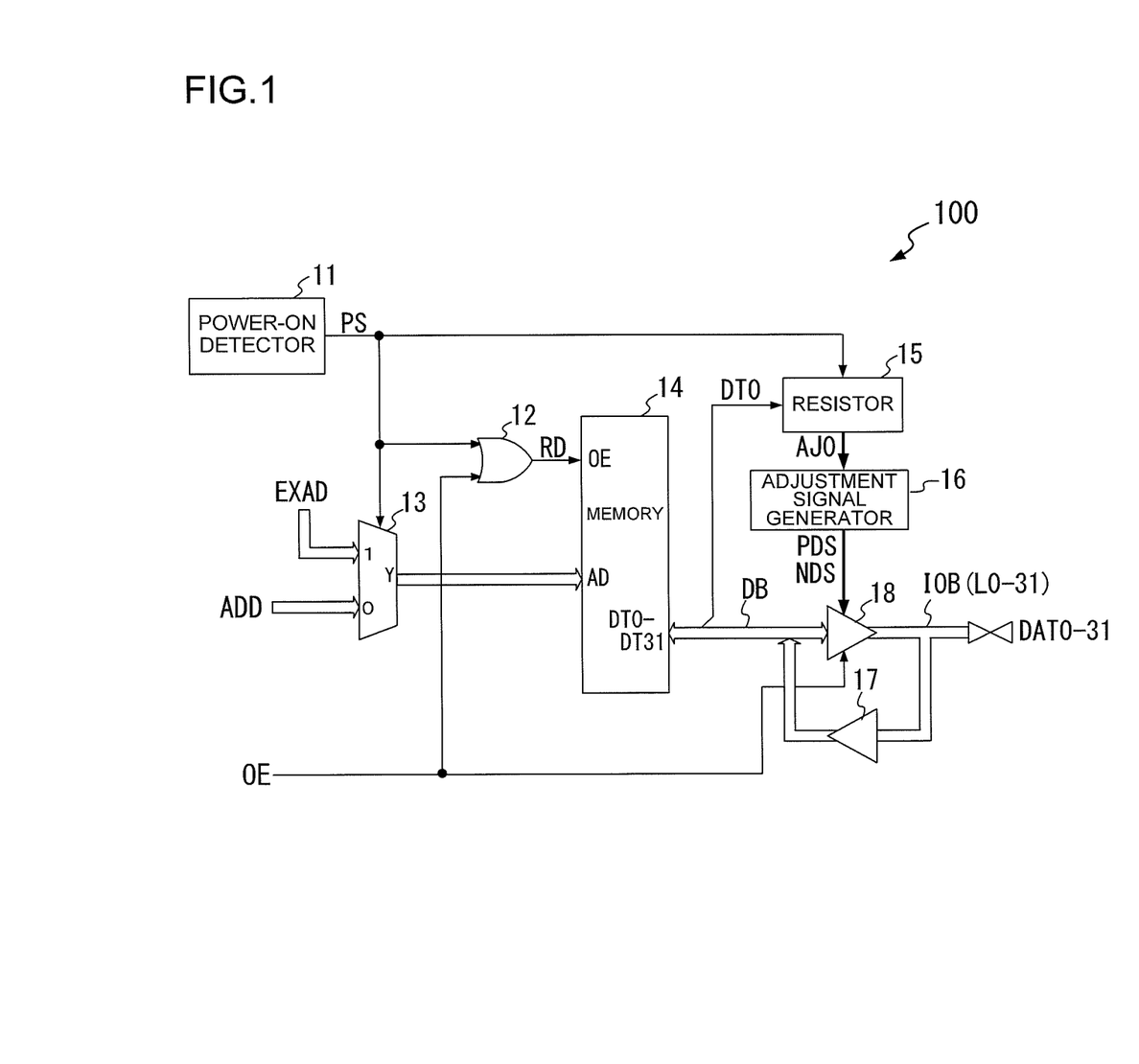
FIG. 1 is a block diagram showing an example of the configuration of a semiconductor memory device 100, as a semiconductor device according to the present invention.

FIG. 1 is a block diagram schematically showing the configuration of a semiconductor memory device 100, as an example of a semiconductor device according to the present invention. As shown in FIG. 1, the semiconductor memory device 100 includes a power-on detector 11, an OR gate 12, a selector 13, a nonvolatile memory 14, a resistor 15, an adjustment signal generator 16, an input driver 17, and an output driver 18.

Figure 2:
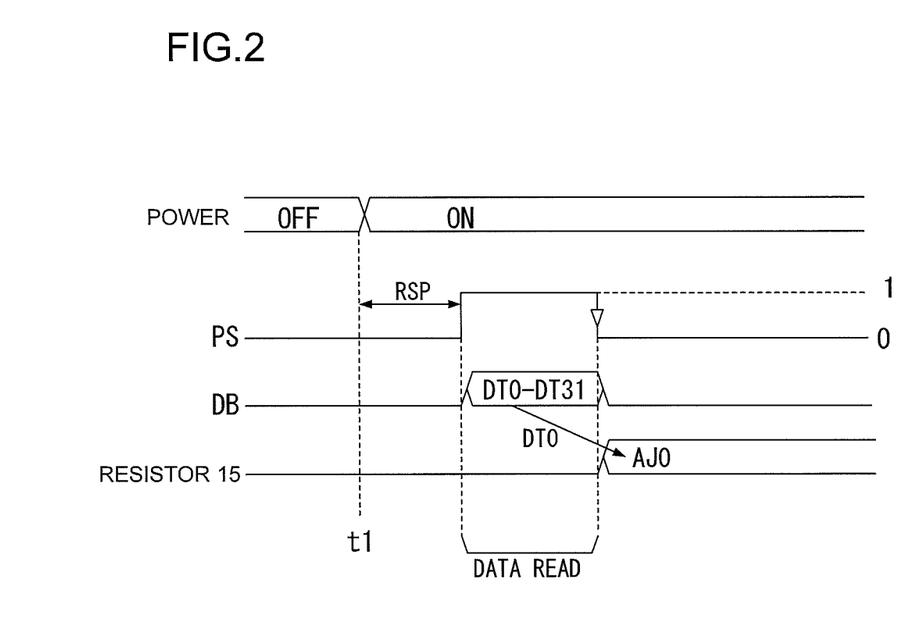

The power-on detector 11 generates a single-pulse power-on detection signal PS that changes from a logic level 0 to a logic level 1 at a time when a predetermined initialization period RSP has elapsed from a time t1 of turning on a power supply, as shown in FIG. 2, in response to powering on, and maintains the logic level 1 for a predetermined period of time. The power-on detector 11 supplies the power-on detection signal PS to the OR gate 12, the selector 13, and the resistor 15.

The OR gate 12 supplies the power-on detection signal PS or an output enable signal OE supplied from the outside to the nonvolatile memory 14 as a readout signal RD that triggers a data readout.

The selector 13 selects one of a data address ADD and a specific address EXAD on the basis of the power-on detection signal PS, and supplies the selected address to the nonvolatile memory 14. That is, the selector 13 supplies the specific address EXAD to the nonvolatile memory 14, while the power-on detection signal PS has the logic level "1" (hereinafter, referred to as logic level 1), as shown in FIG. 2. On the other hand, the selector 13 supplies the data address ADD to the nonvolatile memory 14, while the power-on detection signal PS has the logic level "0" (hereinafter, referred to as logic level 0).

Note that, the data address ADD is, for example, 32-bit address information supplied from the outside of the semiconductor memory device 100. The specific address EXAD is, for example, address information that indicates an address in which output adjustment data to adjust the current driving ability (i.e., current supply ability) of the output driver 18 is stored in 32 bits.

Figure 3:
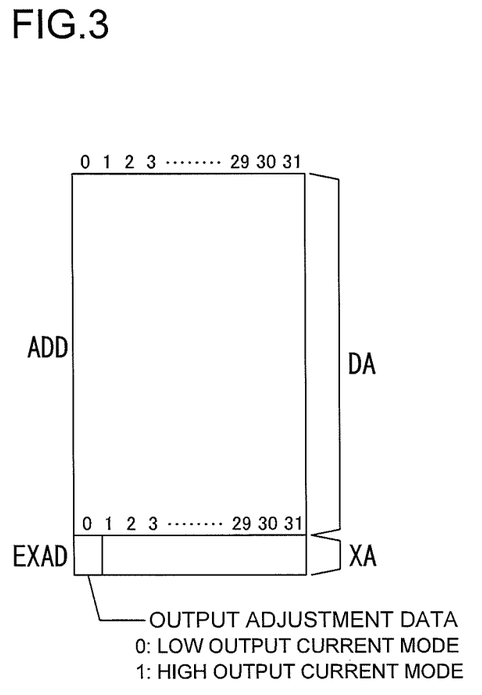
FIG. 3 is a drawing showing an example of the configuration of a storage area of a nonvolatile memory 14.

The nonvolatile memory 14 is, for example, a nonvolatile semiconductor memory such as a NOR or NAND flash memory. As shown in FIG. 3, a data storage area of the nonvolatile memory 14 is divided into a normal data area DA in which normal data is stored, and a specific area XA in which the output adjustment data is stored. At this time, the data address ADD designates a data storage address in the normal data area DA. On the other hand, the specific address EXAD designates a data storage address in the specific area XA.

The specific area XA is a dedicated area in which the output adjustment data to adjust the current driving ability of the output driver 18 is stored. For example, when the current driving ability of the output driver 18 is adjusted to two levels, that is, in a low output current mode and a high output current mode, as shown in FIG. 3, the output adjustment data having a logic level 0 (i.e., low output current mode) or a logic level 1 (i.e., high output current mode) is written to the bit 0 of the specific area XA in advance.

When the readout signal RD has a logic level 1, the nonvolatile memory 14 is turned into a data readout state, and, for example, 32-bit data signals DT0 to DT31 stored in an address that is indicated by the address (ADD or EXAD) supplied from the selector 13 are sent to a data bus DB. On the other hand, in a data write state, the nonvolatile memory 14 receives, for example, 32-bit data signals DAT0 to DAT31, which are supplied from the outside through an input and output data bus IOB, through the input driver 17 and the data bus DB, and writes the 32-bit data signals DAT0 to DAT31 to an address indicated by the address (i.e., ADD or EXAD). The input and output data bus IOB includes lines L0 to L31, which transmit the data signals DAT0 to DAT31, respectively, on an individual basis.

As shown in FIG. 2, the resistor 15 captures and holds the data signal DT0 corresponding to the bit 0 of the data signals DT0 to DT31, that is, the output adjustment data, at the timing of the falling edge of the single-pulse power-on detection signal PS. The resistor 15 supplies an output adjustment data AJ0, which indicates the level (i.e., logic level 0 or 1) of DT0, to the adjustment signal generator 16.

Figure 4:
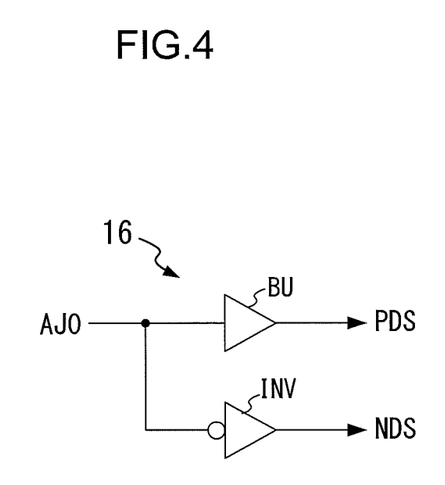
FIG. 4 is a circuit diagram showing the internal configuration of an adjustment signal generator 16.

FIG. 4 is a circuit diagram showing an example of the internal configuration of the adjustment signal generator 16. In FIG. 4, a buffer BU generates a p-channel output adjustment signal PDS that indicates the level (i.e., logic level 0 or 1) of the output adjustment data AJ0, and supplies the p-channel output adjustment signal PDS to the output driver 18. An inverter INV generates an n-channel output adjustment signal NDS having an inverted logic level of the output adjustment data AJ0, and supplies the n-channel output adjustment signal NDS to the output driver 18. That is, the adjustment signal generator 16 supplies the p-channel output adjustment signal PDS having the logic level of the output adjustment data AJ0 and the n-channel output adjustment signal NDS having the inverted logic level of the output adjustment data AJ0 to the output driver 18.

The output driver 18, which has a variable current driving ability (or current supply ability), amplifies, for example, the 32-bit data signals DT0 to DT31 on an individual basis and obtains data signals DAT0 to DAT31. The output driver 18 outputs the data signals DAT0 to DAT31 to the outside through the input and output data bus IOB.

Figure 5:
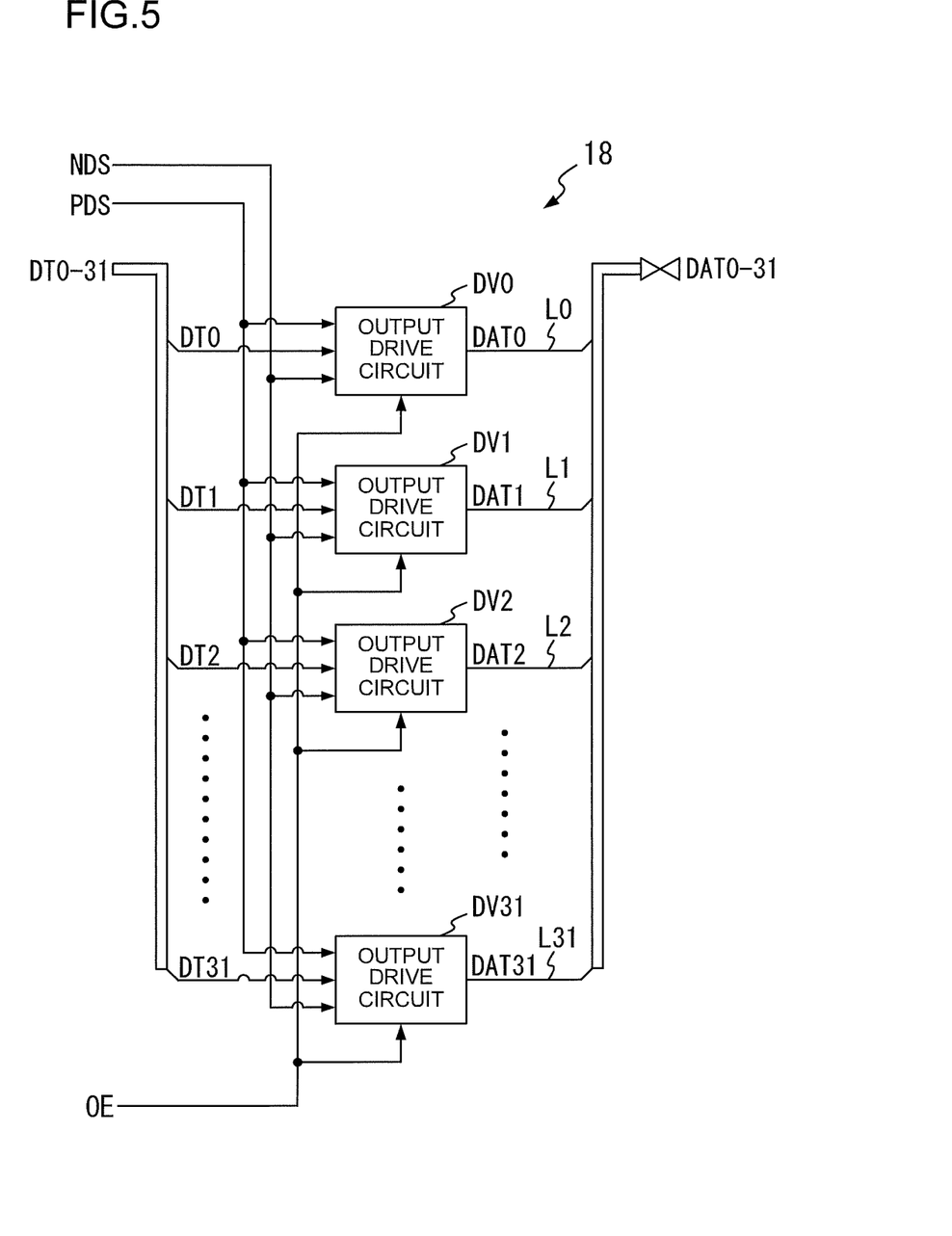
FIG. 5 is a block diagram showing the internal configuration of an output driver 18.

FIG. 5 is a block diagram showing the internal configuration of the output driver 18. As shown in FIG. 5, the output driver 18 has output drive circuits DV0 to DV31, which are provided for, for example, the individual 32-bit data signals DT0 to DT31, respectively. To each of the output drive circuits DV0 to DV31, the output enable signal OE, the p-channel output adjustment signal PDS, and the n-channel output adjustment signal NDS are supplied.

The output drive circuits DV0 to DV31 have the same circuit configuration. Excerpting the output drive circuit DV0 of the output drive circuits DV0 to DV31, the circuit configuration thereof will be described.

Figure 6:
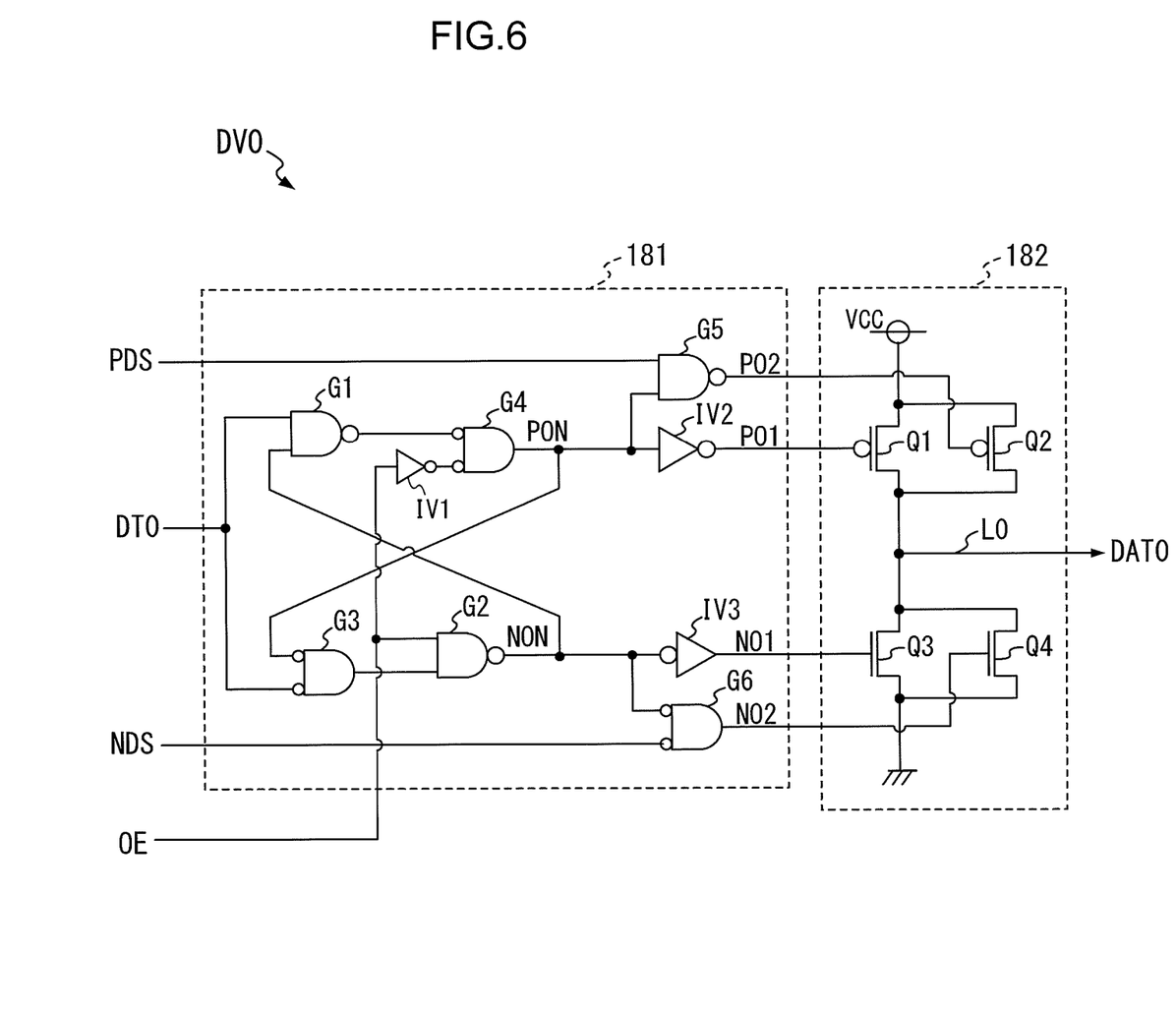
FIG. 6 is a circuit diagram showing an example of an output drive circuit DV0.

FIG. 6 is a circuit diagram of the output drive circuit DV0. As shown in FIG. 6, the output drive circuit DV0 has a pre-drive stage 181 and a main drive stage 182.

The pre-drive stage 181 includes NAND gates G1 and G2, NOR gates G3 and G4, an inverter IV1, a NAND gate G5, a NOR gate G6, and inverters IV2 and IV3.

The data signal DT0 is supplied to a first input terminal of the NAND gate G1, and a binary n-channel drive signal NON output from the NAND gate G2 is supplied to a second input terminal of the NAND gate G1. An output terminal of the NAND gate G1 is connected to a first input terminal of the NOR gate G4. To a second input terminal of the NOR gate G4, an inverted signal of the output enable signal OE, the logic level of which is inverted by the inverter IV1, is supplied. The data signal DT0 is supplied to a first input terminal of the NOR gate G3, and a binary p-channel drive signal PON output from the NOR gate G4 is supplied to a second input terminal of the NOR gate G3. An output terminal of the NOR gate G3 is connected to a first input terminal of the NAND gate G2. To a second input terminal of the NAND gate G2, the output enable signal OE is supplied.

According to the configuration described above, when the output enable signal OE has a logic level 0 indicating a disable state, the NOR gate G4 generates the p-channel drive signal PON having a logic level 0, which makes the line L0 into a high impedance state. On the other hand, when the output enable signal OE has a logic level 1 indicating an enable state, the NOR gate G4 generates the p-channel drive signal PON having the same logic level as the data signal DT0 read out from the nonvolatile memory 14. The NOR gate G4 supplies the above-described p-channel drive signal PON to each of the NOR gate G3, the NAND gate G5, and the inverter IV2.

Also, according to the configuration described above, when the output enable signal OE has the logic level 0 indicating the disable state, the NAND gate G2 generates the n-channel drive signal NON having a logic level 1, which makes the line L0 into the high impedance state. On the other hand, when the output enable signal OE has the logic level 1 indicating the enable state, the NAND gate G2 generates the n-channel drive signal NON having the same logic level as the data signal DT0 read out from the nonvolatile memory 14. The NAND gate G2 supplies the above-described n-channel drive signal NON to each of the NAND gate G1, the NOR gate G6, and the inverter IV3.

The inverter IV2 supplies a signal having an inverted logic level of the p-channel drive signal PON to the main drive stage 182 as a first p-channel drive signal PO1. When the p-channel output adjustment signal PDS has a logic level 0, the NAND gate G5 supplies a second p-channel drive signal PO2 having a logic level 1 to the main drive stage 182. On the other hand, when the p-channel output adjustment signal PDS has a logic level 1, the NAND gate G5 supplies a signal having an inverted logic level of the p-channel drive signal PON to the main drive stage 182 as a second p-channel drive signal PO2.

The inverter IV3 supplies a signal having an inverted logic level of the n-channel drive signal NON to the main drive stage 182 as a first n-channel drive signal NO1. When the n-channel output adjustment signal NDS has a logic level 1, the NOR gate G6 supplies a second n-channel drive signal NO2 having a logic level 0 to the main drive stage 182. On the other hand, when the n-channel output adjustment signal NDS has a logic level 0, the NOR gate G6 supplies a signal having an inverted logic level of the n-channel drive signal NON to the main drive stage 182 as a second n-channel drive signal NO2.

The main drive stage 182 includes p-channel MOS (metal oxide semiconductor) transistors Q1 and Q2 connected in parallel, and n-channel MOS transistors Q3 and Q4 connected in parallel. Both of the transistors Q1 and Q2 are supplied with a supply voltage VCC at a source, and connected to the line L0 at a drain. The first p-channel drive signal PO1 is supplied to a gate of the transistor Q1. The second p-channel drive signal PO2 is supplied to a gate of the transistor Q2. Both of the transistors Q3 and Q4 are supplied with a ground voltage at a source, and connected to the line L0 at a drain. The first n-channel drive signal NO1 is supplied to a gate of the transistor Q3. A second n-channel drive signal NO2 is supplied to a gate of the transistor Q4. The main drive stage 182 outputs the data signal DAT0 having a logic level corresponding to the voltage of the line L0.

As described above, the main drive stage 182 has such a configuration that a first push-pull amplifier (hereinafter called first PP amplifier) including the transistors Q1 and Q3 and a second push-pull amplifier (hereinafter called second PP amplifier) including the transistors Q2 and Q4 are connected in parallel. Note that, in the main drive stage 182, the first PP amplifier (Q1 and Q3) is always in an active state, which enables an amplification operation. The second PP amplifier (Q2 and Q4) is in an active state, when the p-channel output adjustment signal PDS has the logic level 1 and the n-channel output adjustment signal NDS has the logic level 0. On the other hand, the second PP amplifier (Q2 and Q4) is in a state of stopping the amplification operation, i.e. a so-called inactive state, when the p-channel output adjustment signal PDS has the logic level 0 and the n-channel output adjustment signal NDS has the logic level 1.

At this time, when both of the first and second PP amplifiers are in the active state, the main drive stage 182 sends a relatively high current that is a combination of currents sent from the respective first and second PP amplifiers to the line L0. On the other hand, when the second PP amplifier, out of the first and second PP amplifiers, is in the inactive state, the main drive stage 182 sends only a current sent from the first PP amplifier to the line L0.

Operation for adjusting the current driving ability of the semiconductor memory device 100 having the above-described configuration will be described below.

Note that, before operating the semiconductor memory device 100, output adjustment data, which establishes the current driving ability of the output driver 18, is written in advance to the specific area XA, indicated by the specific address EXAD, of the nonvolatile memory 14 as shown in FIG. 3. For example, when the output driver 18 is operated in the low output current mode with a low current driving ability, output adjustment data having a logic level 0 is written in advance to the bit 0 of the specific area XA of the nonvolatile memory 14. On the other hand, when the output driver 18 is operated in the high output current mode with a high current driving ability, output adjustment data having a logic level 1 is written in advance to the bit 0 of the specific area XA of the nonvolatile memory 14.

Upon powering on the semiconductor memory device 100, a single-pulse power-on detection signal PS is generated as shown in FIG. 2 in response to powering on. In response to the power-on detection signal PS, the nonvolatile memory 14 sends out 32-bit data signals DT0 to DT31 stored in the specific area XA to the data bus DB shown in FIG. 1. The resistor 15 captures and holds only the level of the data signal DT0 corresponding to the bit 0 of the data signals DT0 to DT31, that is, output adjustment data, at the timing of the falling edge of the single-pulse power-on detection signal PS shown in FIG. 2. The resistor 15 supplies output adjustment data AJ0, which represents the level of the held output adjustment data, to the adjustment signal generator 16.

Figure 7:
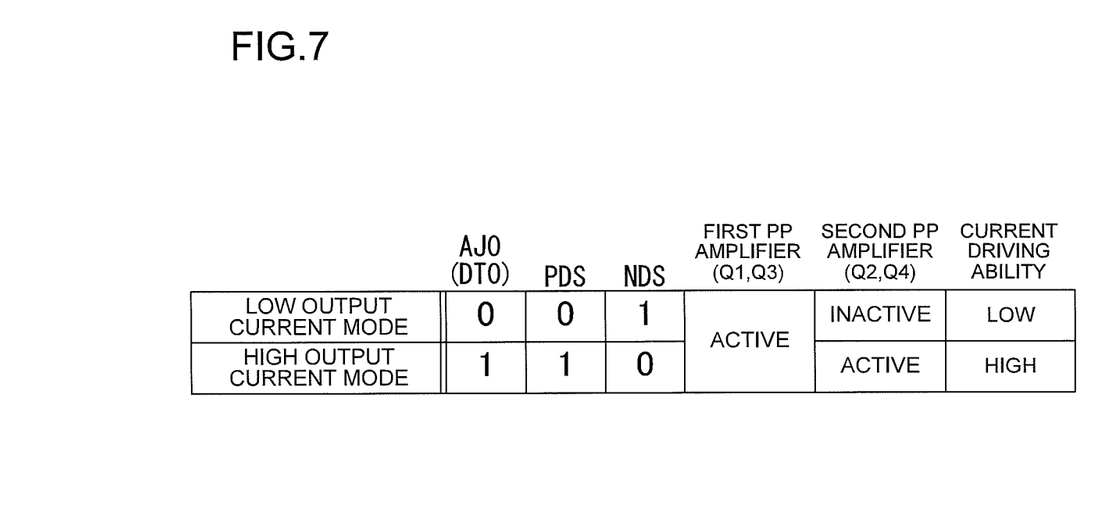
FIG. 7 is a table showing an example of setting conditions for a current driving ability.

When the output adjustment data AJ0 has a logic level 0, as shown in FIG. 7, the adjustment signal generator 16 supplies a p-channel output adjustment signal PDS having a logic level 0 and an n-channel output adjustment signal NDS having a logic level 1 to each of the output drive circuits DV0 to DV31. Thus, the first PP amplifier (Q1 and Q3) included in the main drive stage 182 of each of the output drive circuits DV0 to DV31 is put into an active state as shown in FIG. 7, while the second PP amplifier (Q2 and Q4) is put into an inactive state as shown in FIG. 7. Therefore, at this time, the output driver 18 is set in the low output current mode having a low current driving ability.

On the other hand, when the output adjustment data AJ0 has a logic level 1, as shown in FIG. 7, the adjustment signal generator 16 supplies a p-channel output adjustment signal PDS having a logic level 1 and an n-channel output adjustment signal NDS having a logic level 0 to each of the output drive circuits DV0 to DV31. Thus, both of the first PP amplifier (Q1 and Q3) and the second PP amplifier (Q2 and Q4) included in the main drive stage 182 of each of the output drive circuits DV0 to DV31 are set to be in the active state as shown in FIG. 7. Therefore, at this time, the output driver 18 is set in the high output current mode having a high current driving ability.

As described above, in the semiconductor memory device 100, the output adjustment data to adjust the current driving ability of the output driver 18 is written to the specific area (XA) of the nonvolatile memory 14, when shipping from a factory or initial use after production shipment. Thus, whenever the semiconductor memory device 100 is powered on after that, the output adjustment data is automatically read out from the specific area (XA) of the nonvolatile memory 14, and the current driving ability of the output driver 18 is adjusted on the basis of the output adjustment data.

Therefore, the semiconductor memory device 100 makes it possible to reduce the size of the device, as compared with a configuration in which an adjustment value for the current driving ability is set using a fuse element. Furthermore, in the semiconductor memory device 100, the output adjustment data is written in the nonvolatile memory, thus eliminating the need for providing a specific writing unit for writing the output adjustment data to the device. Therefore, the semiconductor memory device 100 allows reducing manufacturing cost, as compared with a configuration in which the output adjustment data is stored in the device using the fuse element.

In the above embodiment, the current driving ability of the output driver 18 is adjustable to the two levels (i.e., low output current mode and high output current mode), but may be adjustable to a plurality of, for example, three or more levels.

In the above embodiment, in the main drive stage 182, both of the p-channel transistor Q2 and the n-channel transistor Q4 of the second PP amplifier are set to be in an active or inactive state, but may be independently set to be in an active or inactive state. The transistors themselves included in the main drive stage 182 may have different current driving abilities.

Figure 8:
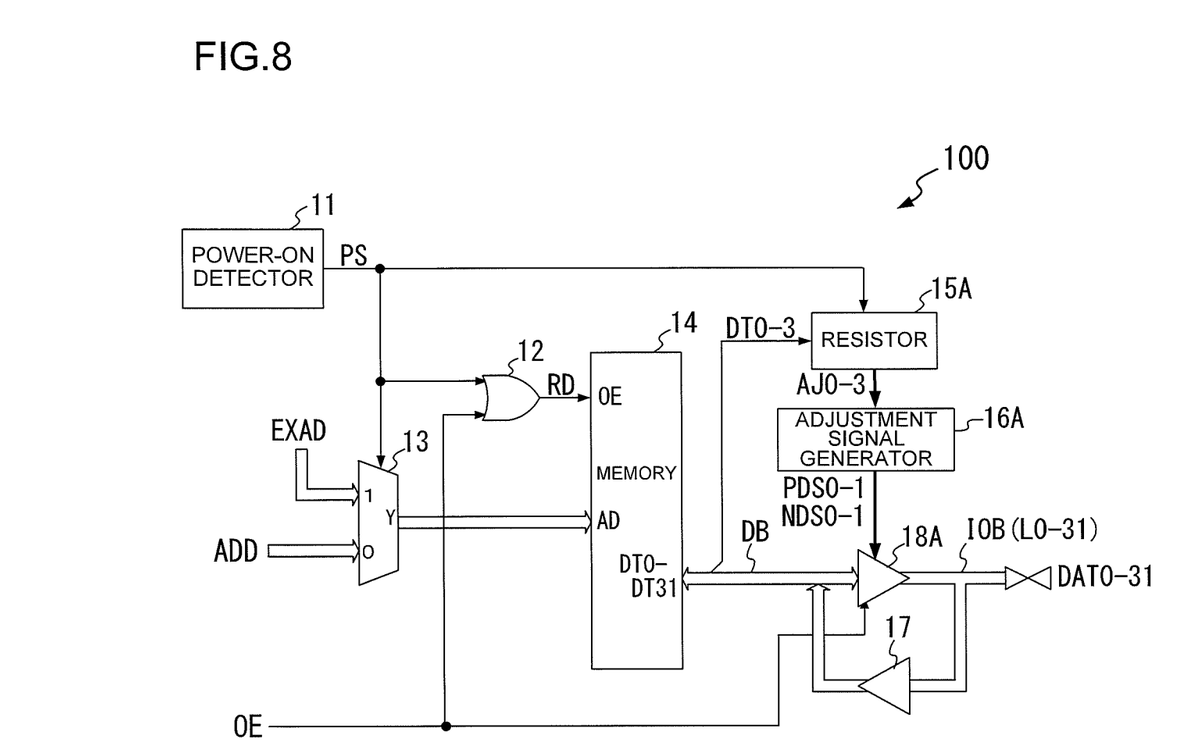
FIG. 8 is a block diagram showing another example of the configuration of the semiconductor memory device 100.
Figure 9:
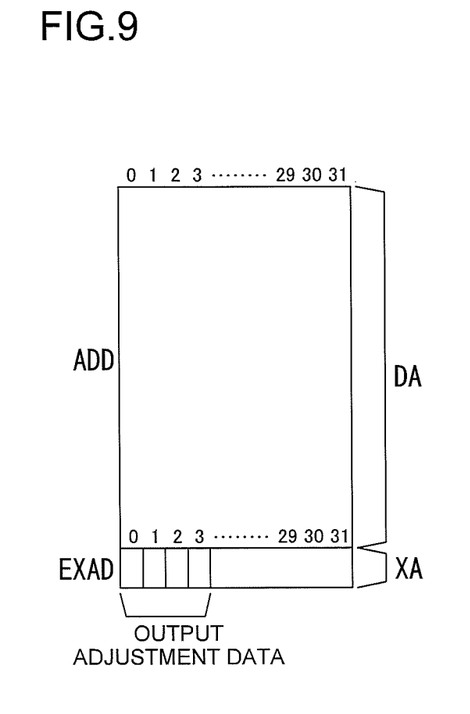
FIG. 9 is a drawing showing another example of the configuration of the storage area of the nonvolatile memory 14.

FIG. 8 is a block diagram showing another configuration of the semiconductor memory device 100, which is designed in consideration of the matter described above. In the configuration of FIG. 8, a resistor 15A, an adjustment signal generator 16A, and an output driver 18A are adopted instead of the resistor 15, the adjustment signal generator 16, and the output driver 18, respectively. The other configuration of FIG. 8 is the same as that of FIG. 1. However, when the configuration of FIG. 8 is adopted, as shown in FIG. 9, 4-bit output adjustment data to adjust the current driving ability of the output driver 18A is written in the bits 0 to 3 in advance, having an address indicated by a specific address EXAD, of the nonvolatile memory 14. At this time, p-channel side current driving ability setting information, which specifies a current driving ability sent out from a p-channel side of the PP amplifiers in the main drive stage in four levels, is written to the bits 0 and 1 as the output adjustment data. On the other hand, n-channel side current driving ability setting information, which specifies a current driving ability drawn into an n-channel side of the PP amplifiers in the main drive stage in four levels, is written to the bits 2 and 3 as the output adjustment data.

The resistor 15A captures and holds the levels of data signals DT0 to DT3 corresponding to the bits 0 to 3 of data signals DT0 to DT31 read out from the address indicated by the specific address EXAD of the nonvolatile memory 14 in response to a power-on detection signal PS shown in FIG. 2, that is, the output adjustment data described above. The resistor 15A supplies output adjustment data AJ0 to AJ3, that is, the 4-bit output adjustment data captured and held as described above to the adjustment signal generator 16A.

Figure 10:
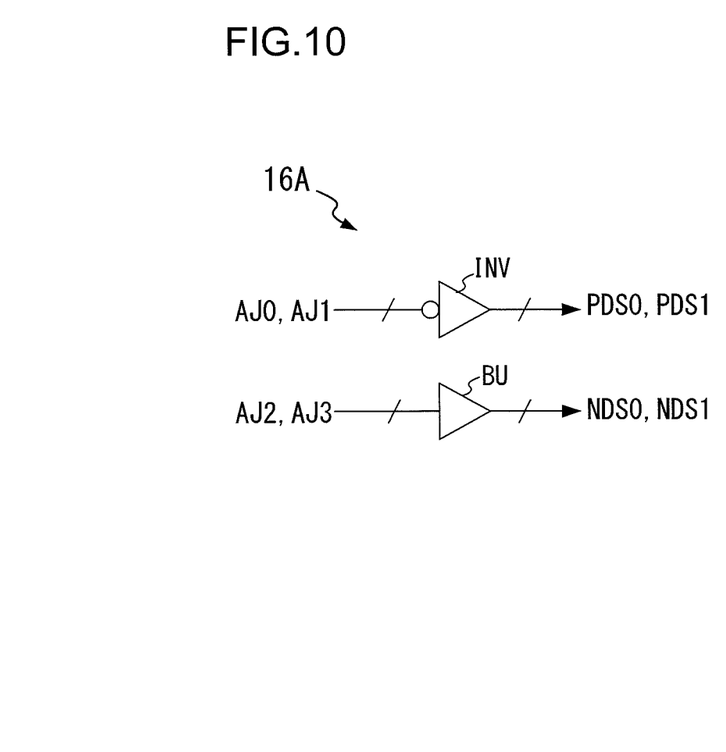
FIG. 10 is a circuit diagram showing the internal configuration of an adjustment signal generator 16A.

FIG. 10 is a circuit diagram showing an example of the internal configuration of the adjustment signal generator 16A. In FIG. 10, an inverter INV generates p-channel output adjustment signals PDS0 and PDS1 having inverted logic levels of the output adjustment data AJ0 and AJ1, respectively. A buffer BU generates n-channel output adjustment signals NDS0 and NDS1 having the levels (i.e., logic level 0 or 1) of the output adjustment data AJ2 and AJ3, respectively. The adjustment signal generator 16A supplies the p-channel output adjustment signals PDS0 and PDS1 and the n-channel output adjustment signals NDS0 and NDS1 to the output driver 18A.

Figure 11:
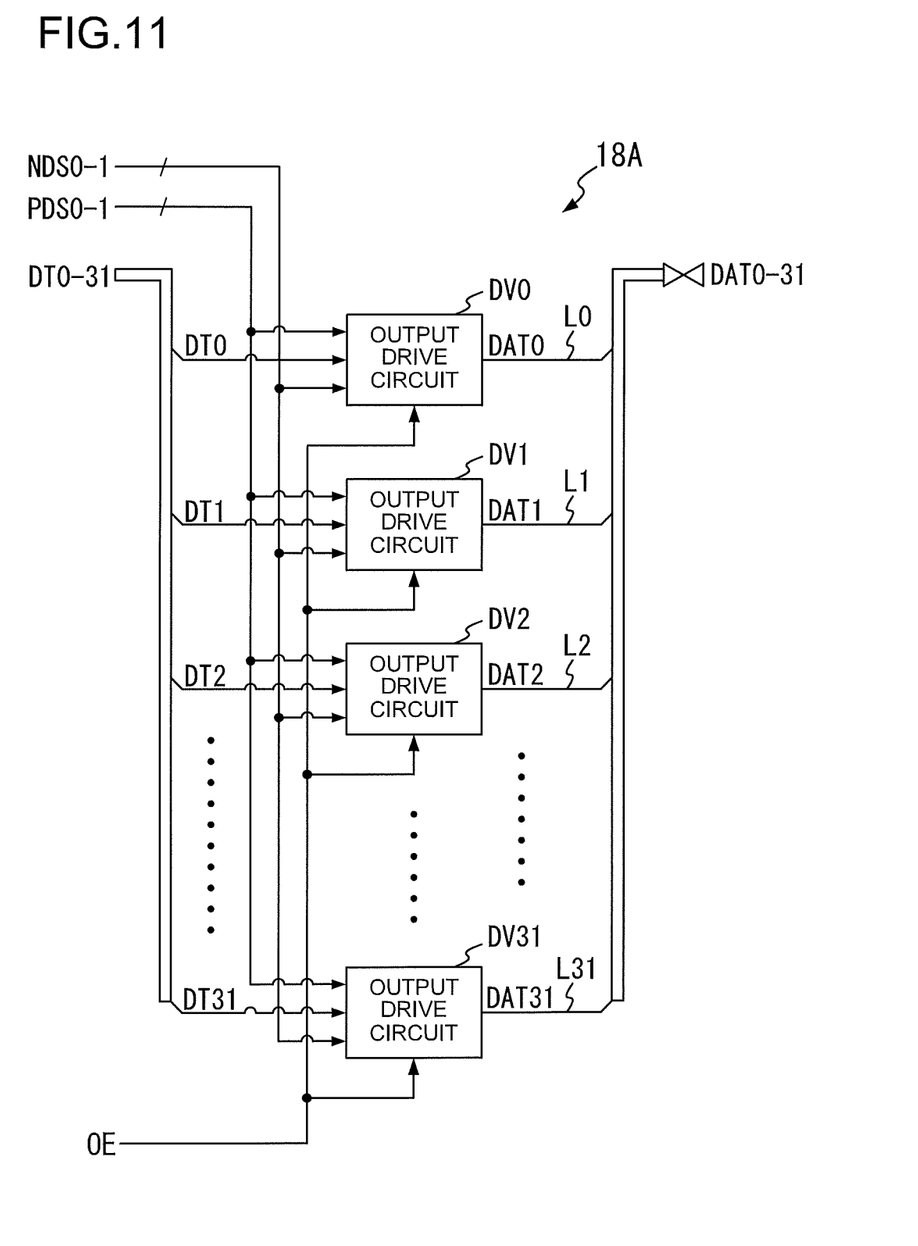
FIG. 11 is a block diagram showing the internal configuration of an output driver 18A.

FIG. 11 is a block diagram showing the internal configuration of the output driver 18A. The output driver 18A includes output drive circuits DV0 to DV31, which are provided for, for example, the 32-bit data signals DT0 to DT31, respectively, just as with the configuration of FIG. 5. In the configuration shown in FIG. 11, the p-channel output adjustment signals PDS0 and PDS1 and the n-channel output adjustment signals NDS0 and NDS1, as well as an output enable signal OE, are supplied to each of the output drive circuits DV0 to DV31. The output drive circuits DV0 to DV31 have the same circuit configuration.

Excerpting the output drive circuit DV0 of the output drive circuits DV0 to DV31, the circuit configuration thereof will be described below.

Figure 12:
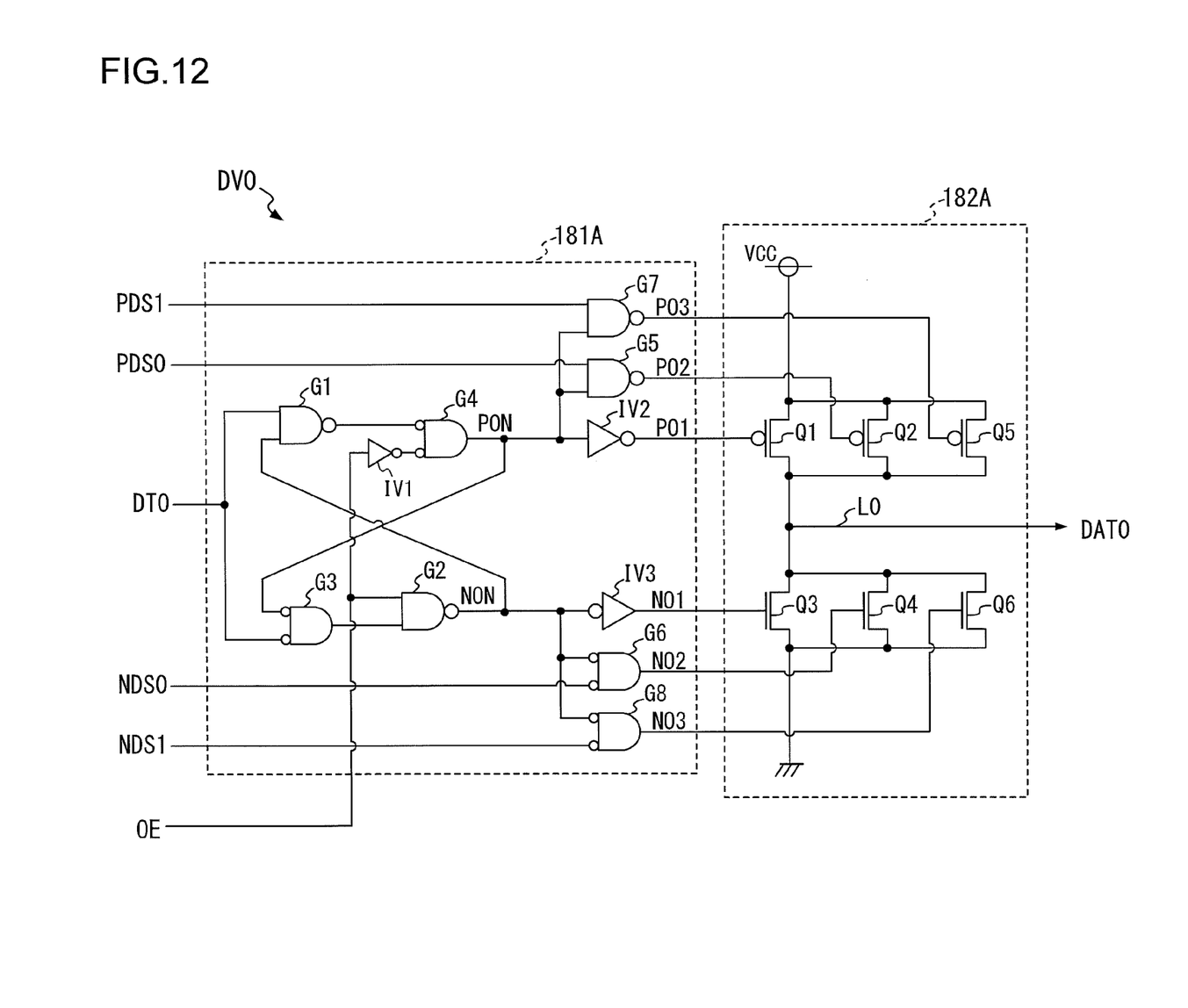
FIG. 12 is a circuit diagram showing another example of the output drive circuit DV0.

FIG. 12 is a circuit diagram of the output drive circuit DV0. As shown in FIG. 12, the output drive circuit DV0 has a pre-drive stage 181A and a main drive stage 182A.

The pre-drive stage 181A has the same internal configuration as the pre-drive stage 181 shown in FIG. 6, except that in the pre-drive stage 181A, a NAND gate G5 receives the p-channel output adjustment signal PDS0 instead of the p-channel output adjustment signal PDS, a NOR gate G6 receives the n-channel output adjustment signal NDS0 instead of the n-channel output adjustment signal NDS, and a NAND gate G7 and a NOR gate G8 are added.

That is, when the p-channel output adjustment signal PDS0 has a logic level 0, the NAND gate G5 supplies a second p-channel drive signal PO2 having a logic level 1 to the main drive stage 182A. On the other hand, when the p-channel output adjustment signal PDS0 has a logic level 1, the NAND gate G5 supplies a signal having an inverted logic level of a p-channel drive signal PON to the main drive stage 182A, as a second p-channel drive signal PO2.

When the p-channel output adjustment signal PDS1 has a logic level 0, the NAND gate G7 supplies a third p-channel drive signal PO3 having a logic level 1 to the main drive stage 182A. On the other hand, when the p-channel output adjustment signal PDS1 has a logic level 1, the NAND gate G7 supplies a signal having an inverted logic level of the p-channel drive signal PON to the main drive stage 182A, as a third p-channel drive signal PO3.

In FIG. 12, when the n-channel output adjustment signal NDS0 has a logic level 1, the NOR gate G6 supplies a second n-channel drive signal NO2 having a logic level 0 to the main drive stage 182A. On the other hand, when the n-channel output adjustment signal NDS0 has a logic level 0, the NOR gate G6 supplies a signal having an inverted logic level of an n-channel drive signal NON to the main drive stage 182A, as a second n-channel drive signal NO2.

When the n-channel output adjustment signal NDS1 has a logic level 1, the NOR gate G8 supplies a third n-channel drive signal NO3 having a logic level 0 to the main drive stage 182A. On the other hand, when the n-channel output adjustment signal NDS1 has a logic level 0, the NOR gate G8 supplies a signal having an inverted logic level of the re-channel drive signal NON to the main drive stage 182A, as a third n-channel drive signal NO3.

The main drive stage 182A has the same configuration as the main drive stage 182 shown in FIG. 6, except that a p-channel MOS transistor Q5 is connected in parallel with the transistors Q1 and Q2, and an n-channel MOS transistor Q6 is connected in parallel with the transistors Q3 and Q4. Specifically, a source of the transistor Q5 is connected to the sources of the transistors Q1 and Q2, and a drain of the transistor Q5 is connected to the drains of the transistors Q1 and Q2. Further, a source of the transistor Q6 is connected to the sources of the transistors Q3 and Q4, and a drain of the transistor Q6 is connected to the drains of the transistors Q3 and Q4.

In the main drive stage 182A, when IP represents the current driving ability of each of the transistors Q1 and Q2 by itself, the current driving ability of the transistor Q5 by itself is twice of the current driving ability IP, that is, 2.IP. Also, in the main drive stage 182A, when IN represents the current driving ability of each of the transistors Q3 and Q4 by itself, the current driving ability of the transistor Q6 by itself is twice of the current driving ability IN, that is, 2.IN.

Operation for adjusting the current driving ability of the semiconductor memory device 100 having the configuration shown in FIGS. 8 to 12 will be described below.

Note that, before operating the semiconductor memory device 100 shown in FIG. 8, 4-bit output adjustment data for adjusting the current driving ability of the output driver 18A is written in advance to the specific area XA of the nonvolatile memory 14 shown in FIG. 9.

Figure 13:
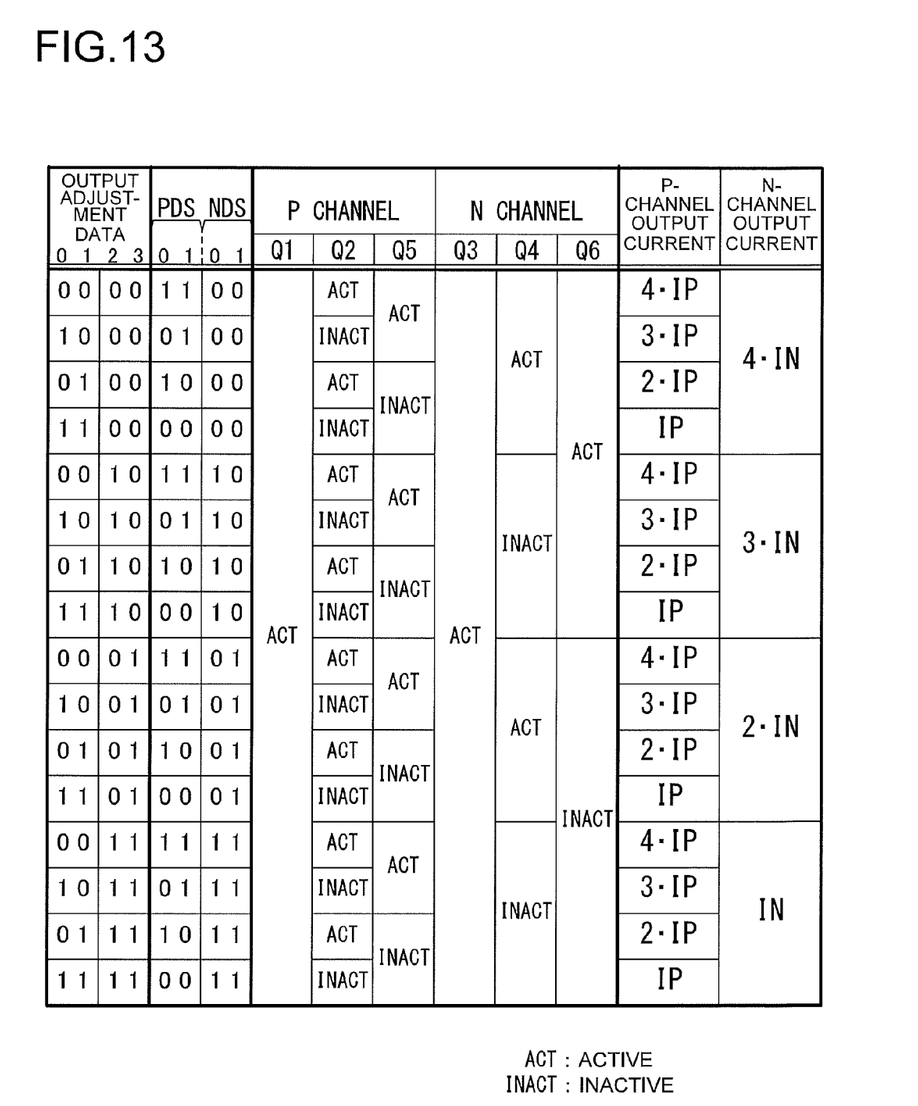
FIG. 13 is a table showing another example of the setting conditions for the current driving ability.

FIG. 13 is a table showing the relationship between the above-described 4-bit output adjustment data and the current driving ability of the output driver 18A adjusted in accordance with the output adjustment data.

The p-channel side current driving ability setting information, which indicates whether each individual of the p-channel transistors Q2 and Q5 of the main drive stage 182A is set to an active state or an inactive state, is written to the bits 0 and 1 of the bits 0 to 3 of the output adjustment data.

For example, when the bit 0 of the output adjustment data has a logic level 0, the p-channel output adjustment signal PDS0 has a logic level 1, and hence the transistor Q2 is set to the active state (ACT). On the other hand, when the bit 0 of the output adjustment data has a logic level 1, the p-channel output adjustment signal PDS0 has a logic level 0, and hence the transistor Q2 is set to the inactive state (INACT).

Also, when the bit 1 of the output adjustment data has a logic level 0, the p-channel output adjustment signal PDS1 has a logic level 1, and hence the transistor Q5 is set to the active state (ACT). On the other hand, when the bit 1 of the output adjustment data has a logic level 1, the p-channel output adjustment signal PDS1 has a logic level 0, and hence the transistor Q5 is set to the inactive state (INACT).

At this time, the p-channel transistor Q1 is always set to the active state (ACT), irrespective of the levels of the output adjustment data.

Therefore, in a p-channel side driver constituted of the p-channel transistors Q1, Q2, and Q5, when all of the transistors Q1, Q2, and Q5 are set to the active state in accordance with the logic levels of the bits 0 and 1 of the output adjustment data, as shown in FIG. 13, the current driving ability of the p-channel side driver becomes 4.IP. As shown in FIG. 13, when only the transistors Q1 and Q5 of the transistors Q1, Q2, and Q5 are set to the active state, the current driving ability of the p-channel side driver becomes 3.IP. As shown in FIG. 13, when only the transistors Q1 and Q2 of the transistors Q1, Q2, and Q5 are set to the active state, the current driving ability of the p-channel side driver becomes 2.IP. Also, as shown in FIG. 13, when only the transistor Q1 of the transistors Q1, Q2, and Q5 are set to the active state, the current driving ability of the p-channel side driver becomes IP.

That is, the current driving ability of the p-channel side driver is adjusted in four levels (IP, 2.IP, 3.IP, and 4.IP) in accordance with the p-channel side current driving ability setting information (i.e., the contents of the bits 0 and 1 of the output adjustment data), which indicates whether each individual of the transistors Q1, Q2 and Q5 is set to the active state or the inactive state.

On the other hand, the n-channel side current driving ability setting information, which indicates whether each individual of the n-channel transistors Q4 and Q6 of the main drive stage 182A is set to the active state or the inactive state, is written to the bits 2 and 3 of the bits 0 to 3 of the output adjustment data.

For example, when the bit 2 of the output adjustment data has a logic level 0, the n-channel output adjustment signal NDS0 has a logic level 0, and hence the transistor Q4 is set to the active state (ACT). On the other hand, when the bit 2 of the output adjustment data has a logic level 1, the n-channel output adjustment signal NDS0 has a logic level 1, and hence the transistor Q4 is set to the inactive state (INACT).

Also, when the bit 3 of the output adjustment data has a logic level 0, the n-channel output adjustment signal NDS1 has a logic level 0, and hence the transistor Q6 is set to the active state (ACT). On the other hand, when the bit 3 of the output adjustment data has a logic level 1, the n-channel output adjustment signal NDS1 has a logic level 1, and hence the transistor Q6 is set to the inactive state (INACT).

At this time, the n-channel transistor Q3 is always set to the active state (ACT), irrespective of the levels of the output adjustment data.

Therefore, in an n-channel side driver constituted of the n-channel transistors Q3, Q4, and Q6, when all of the transistors Q3, Q4, and Q6 are set to the active state in accordance with the logic levels of the bits 2 and 3 of the output adjustment data, as shown in FIG. 13, the current driving ability of the n-channel side driver becomes 4.IN. As shown in FIG. 13, when only the transistors Q3 and Q6 of the transistors Q3, Q4, and Q6 are set to the active state, the current driving ability of the n-channel side driver becomes 3.IN. As shown in FIG. 13, when only the transistors Q3 and Q4 of the transistors Q3, Q4, and Q6 are set to the active state, the current driving ability of the n-channel side driver becomes 2.IN. Also, as shown in FIG. 13, when only the transistor Q3 of the transistors Q3, Q4, and Q6 are set to the active state, the current driving ability of the n-channel side driver becomes IN.

That is, the current driving ability of the n-channel side driver is adjusted in four levels (IN, 2.IN, 3.IN, and 4.IN) in accordance with the n-channel side current driving ability setting information (i.e., the contents of the bits 2 and 3 of the output adjustment data), which indicates whether each individual of the transistors Q3, Q4 and Q6 is set to the active state or the inactive state.

As described above, according to the semiconductor memory device 100 having the configuration shown in FIGS. 8 to 12, the current driving ability of the p-channel side driver (Q1, Q2, and Q5) of the output driver 18A and the current driving ability of the n-channel side driver (Q3, Q4, and Q6) thereof are each independently adjustable in the four levels.

Accordingly, for example, when an overshoot occurs in a data signal sent out from the output driver 18A to the input and output data bus IOB, the levels of the bits 0 and 1 of the output adjustment data are determined so as to reduce the current driving ability of the p-channel side driver (Q1, Q2, and Q5) by one or more levels, and written to the specific area XA of the nonvolatile memory 14 in advance. Also, for example, when an undershoot occurs in a data signal sent out from the output driver 18A to the input and output data bus IOB, the levels of the bits 2 and 3 of the output adjustment data are determined so as to reduce the current driving ability of the n-channel side driver (Q3, Q4, and Q6) by one or more levels, and written to the specific area XA of the nonvolatile memory 14 in advance.

Therefore, according to the configuration shown in FIGS. 8 to 12, even if only one of the overshoot and the undershoot occurs in the data signal sent to the input and output data bus IOB, the suppression process (i.e., a reduction in an output current) for only one of the overshoot and the undershoot can be performed.

The configuration of the present invention is described using the semiconductor memory device 100 in the above embodiment, but the present invention is also applicable to semiconductor devices in which various signal processing circuits having functions other than memory are formed, in a like manner.

In short, the semiconductor device according to the present invention just has to include the following output driver, nonvolatile memory, output adjustment data readout unit, and current driving ability adjustment unit. That is, the output driver (18 and 18A) has a variable current driving ability, and outputs an amplified data signal to the outside through the transmission lines (L0 to L31). The nonvolatile memory (14) has the specific area (XA) in which output adjustment data to adjust the current driving ability of the output driver is stored. The output adjustment data readout unit (11, 12, and 13) reads out the output adjustment data from the specific area of the memory in response to powering on. The current driving ability adjustment unit (15 and 16) adjusts the current driving ability of the output driver on the basis of the output adjustment data read out from the memory.

This application is based on a Japanese Patent Application No. 2016-013631 which is hereby incorporated by reference.

What is claimed is:

1. A semiconductor device comprising:
    an output driver having a variable current driving ability, for outputting an amplified data signal to outside through a transmission line;
    a nonvolatile memory having a specific area for storing output adjustment data to adjust the current driving ability of the output driver;
    an output adjustment data readout unit for reading out the output adjustment data from the specific area of the memory in response to powering on; and
    a current driving ability adjustment unit for adjusting the current driving ability of the output driver on a basis of the output adjustment data read out from the memory.

2. The semiconductor device according to claim 1, wherein
    the memory has a data area in which a data storage address is specified by a data address, and
    the output adjustment data readout unit includes:
        a power-on detector for generating a power-on detection signal in response to powering on;
        a selector for selecting a specific address specifying the address of the specific area, out of the specific address and the data address, and supplying the specific address to the memory in response to the power-on detection signal only during a predetermined period; and
        a readout signal supply unit for supplying a readout signal to the memory in response to the power-on detection signal.

3. The semiconductor device according to claim 1, wherein
    the output driver includes:
        a main drive stage having a plurality of amplifying units each for sending out a current in accordance with the data signal to the transmission line; and
        a pre-drive stage for driving the main drive stage,
    the output adjustment data includes current driving ability setting information that indicates whether each individual of the plurality of amplifying units is set to an active state or an inactive state, and
    the pre-drive stage supplies the data signal only to the amplifying unit indicated to be the active state, out of the plurality of amplifying units, on a basis of the current driving ability setting information of the output adjustment data read out from the memory.

4. The semiconductor device according to claim 3, wherein
    the amplifying units each include:
        a p-channel transistor connected to the transmission line at a drain, and supplied with a supply voltage at a source; and
        an n-channel transistor connected to the transmission line at a drain, and supplied with a ground voltage at a source, and
    the pre-drive stage supplies a drive signal corresponding to the data signal to gates of the p-channel transistor and the n-channel transistor of the amplifying unit indicated to be the active state, out of the plurality of the amplifying units, on a basis of the current driving ability setting information of the output adjustment data read out from the memory.

5. The semiconductor device according to claim 1, wherein
    the output driver includes:
        a main drive stage having a plurality of p-channel transistors each connected to the transmission line at a drain and supplied with a supply voltage at a source, and a plurality of n-channel transistors each connected to the transmission line at a drain and supplied with a ground voltage at a source; and
        a pre-drive stage for driving the main drive stage,
    the output adjustment data includes p-channel side current driving ability setting information that indicates whether each individual of the plurality of p-channel transistors is set to an active state or an inactive state, and n-channel side current driving ability setting information that indicates whether each individual of the plurality of n-channel transistors is set to an active state or an inactive state, and
    the pre-drive stage supplies a p-channel drive signal corresponding to the data signal to a gate of the p-channel transistor indicated to be the active state, out of the plurality of p-channel transistors, on a basis of the p-channel side current driving ability setting information, and supplies an n-channel drive signal corresponding to the data signal to a gate of the n-channel transistor indicated to be the active state, out of the plurality of n-channel transistors, on a basis of the n-channel side current driving ability setting information.

6. A semiconductor memory device comprising:
    a nonvolatile memory unit having a data area in which a data storage address is specified by a data address and a specific area for storing output adjustment data to adjust a current driving ability;
    an output driver having a variable current driving ability, for outputting data read out from the memory unit to outside;

an output adjustment data readout unit for reading out the output adjustment data from the specific area of the memory unit in response to powering on; and a current driving ability adjustment unit for adjusting the current driving ability of the output driver on a basis of the output adjustment data read out from the memory unit.

7. The semiconductor memory device according to claim 6, wherein the output adjustment data readout unit includes:
- a power-on detector for generating a power-on detection signal in response to powering on;
- a selector for selecting a specific address specifying an address of the specific area, out of the specific address and the data address, and supplying the specific address to the memory unit in response to the power-on detection signal only during a predetermined period; and
- a readout signal supply unit for supplying a readout signal to the memory unit in response to the power-on detection signal.

* * * * *